US008436683B2

(12) United States Patent
Gehrke

(10) Patent No.: US 8,436,683 B2
(45) Date of Patent: May 7, 2013

(54) HIGH EFFICIENCY AUDIO AMPLIFIER

(76) Inventor: Robert Gehrke, Zossen (DE)

(*) Notice: Subject to any disclaimer, the term of this patent is extended or adjusted under 35 U.S.C. 154(b) by 0 days.

(21) Appl. No.: 13/304,426

(22) Filed: Nov. 25, 2011

(65) Prior Publication Data

US 2012/0133432 A1 May 31, 2012

Related U.S. Application Data

(60) Provisional application No. 61/417,843, filed on Nov. 29, 2010.

(51) Int. Cl.
*H03F 3/04* (2006.01)
(52) U.S. Cl.
USPC .......................................... 330/297; 330/127
(58) Field of Classification Search .......... 330/296–297, 330/127, 129, 134, 279
See application file for complete search history.

(56) References Cited

U.S. PATENT DOCUMENTS

| 5,834,977 A | 11/1998 | Maehara et al. |
| 8,022,761 B2* | 9/2011 | Drogi et al. ................... 330/136 |
| 2009/0212859 A1 | 8/2009 | Lesso et al. |
| 2010/0097148 A1 | 4/2010 | Ye et al. |
| 2012/0293253 A1* | 11/2012 | Khlat et al. ................... 330/127 |

* cited by examiner

*Primary Examiner* — Hieu Nguyen
(74) *Attorney, Agent, or Firm* — Smartpat PLC; Axel Nix

(57) ABSTRACT

An audio amplifier circuit is described which comprises an operational amplifier. The operational amplifier receives an audio input signal and provides an output suitable for connecting a headphone, or a loudspeaker. A step-up converter is provided which supplies the operational amplifier. The audio amplifier is configured to operate in one of multiple operating modes, each of which uses a distinct supply voltage Vcc of the operational amplifier in the audio amplifier. Comparators are used to compare the output voltage of the operational amplifier with a first reference voltage to raise the supply voltage of the operational amplifier, if clipping is imminent. A second comparator is used to compare the output voltage of the operational amplifier with a second reference voltage, indicating that the supply voltage of the operational amplifier can be lowered without the risk of clipping.

9 Claims, 2 Drawing Sheets

HIGH EFFICIENCY AUDIO AMPLIFIER

TECHNICAL FIELD

The present invention generally relates to amplifier circuits, and more particularly, to high efficiency amplifier circuits for use in battery powered applications.

BACKGROUND OF THE INVENTION

Portable audio devices, such as for example MP3 players, radios, or external headphone amplifiers, are typically powered by a battery. The battery's voltage limits the maximum amplitude of the amplifier's output, and thereby the volume of an attached speaker or headphone. The amplifier's output voltage is inherently limited to stay below the supply voltage of the amplifier's end stage. Audio clipping, a distortion of the audio signal, occurs, if the amplifier's end stage becomes saturated.

Class G audio amplifier circuits are known to conserve power and avoid audio clipping by adjusting the voltage that is supplied to an amplifier's end stage. An exemplary class G headphone amplifier circuit is disclosed in U.S. patent application Ser. No. 12/255,537, which is hereby incorporated by reference. The known audio amplifier circuit comprises a voltage generator that generates pairs of differential output voltage at variable amplitudes which are supplied to a headphone amplifier. The voltage generator is controlled by an automatic signal level detector, which analyzes the amplifier's input signal.

Similarly, U.S. patent application Ser. No. 12/434,424 discloses amplifier circuits and methods of operation thereof. The '424 application discloses a variable voltage power supply, which may be designed to output a plurality of discrete output voltages. The variable voltage power supplies are controlled by the input signal to the amplifier. U.S. patent application Ser. No. 12/434,424 is hereby incorporated by reference.

U.S. Pat. No. 5,834,977 discloses an amplifying circuit comprising a step-up converter, which increases the supply voltage to an amplifying circuit from a battery voltage of 12 volts to an increased voltage of 18 volts based on a comparator which compares the output voltage Va of the amplifier with a fixed reference voltage of 10 volts.

SUMMARY OF THE INVENTION

A battery-powered audio amplifier circuit is provided which comprises an operational amplifier. The operational amplifier is configured to receive an audio input signal, for example from an MP3 player, a radio, a cellular telephone, or any other source of electrical audio signals. The operational amplifier provides an audio output signal to a headphone, a loudspeaker, or any other audio device for converting electric energy into sound. The operational amplifier is operatively connected to a step-up converter, which provides a variable supply voltage Vcc to the operational amplifier. The step-up converter is powered by a battery having a voltage Vbat. The step-up converter is controlled by a microcontroller and configured to raise the operational amplifier variable supply voltage Vcc above the battery voltage Vbat. The audio amplifier circuit operates in one of multiple operating modes. Each of the multiple operating modes is characterized in that a distinct supply voltage Vcc is provided to the operational amplifier.

In one particular operating mode the step-up converter may be disabled, and battery voltage Vbatt may be applied directly to the operational amplifier. This particular operating mode with disabled step-up converter is preferably selected, if the output signal amplitude is low. If the output signal amplitude is high, the variable supply voltage Vcc to the operational amplifier may be raised in several steps from a minimum voltage to a maximum voltage. In a particular example the step-up converter may be configured to raise the variable supply voltage Vcc to the operational amplifier in 3 steps of 2.3V each from a minimum voltage of 5V to a maximum voltage of 11.9V.

A first comparator may be used to compare the amplitude of the output signal of the operational amplifier with a first reference voltage Vref1 to detect the risk of clipping. The comparator may be operatively connected to the microcontroller, which controls the step-up converter. If the output signal falls below the first reference voltage Vref1 the microcontroller causes the step-up converter to increase its output voltage Vcc and thereby the supply voltage of the operational amplifier by one step.

A second comparator may be used to compare the amplitude of the output signal of the operational amplifier with a second reference voltage Vref2 to detect, if the supply voltage of the operational amplifier can be lowered by one step without risking clipping. The second comparator may be operatively connected to the microcontroller. The microcontroller may be configured to lower the output voltage Vcc of the step-up converter by one step, if the output signal has not fallen below Vref2 for a predetermined amount of time.

The following detailed description of the invention is merely exemplary in nature and is not intended to limit the invention or the application and uses of the invention. Furthermore, there is no intention to be bound by any theory presented in the preceding background of the invention or the following detailed description of the invention.

DETAILED DESCRIPTION

Figure 1:
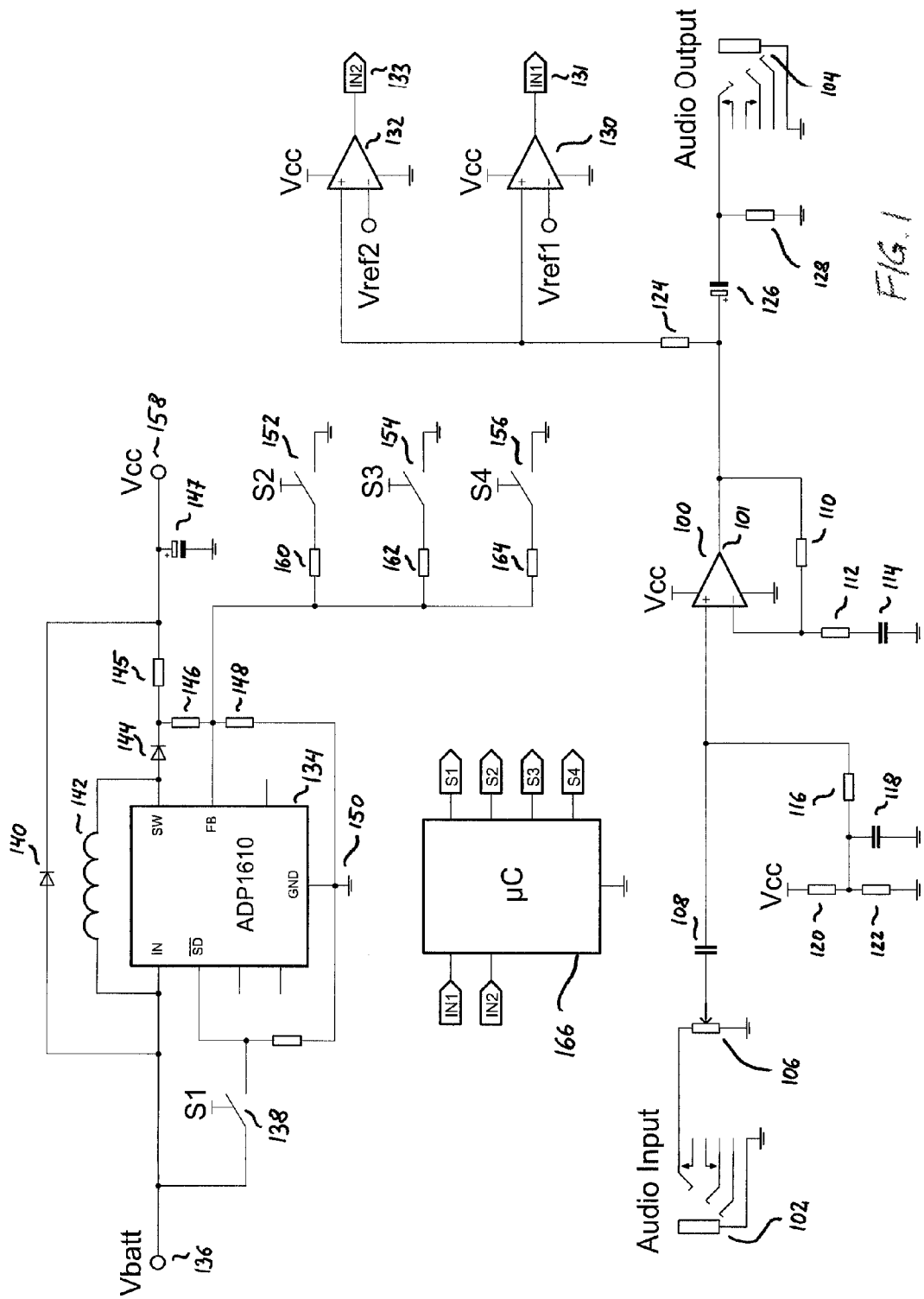
FIG. 1 is a circuit diagram of an exemplary class G audio amplifier circuit.

Referring to FIG. 1, a circuit diagram of an exemplary class G audio amplifier circuit 1 in which the principles of the present invention may be advantageously practiced is illustrated generally. The exemplary audio amplifier circuit 1 comprises an operational amplifier 100, which is configured to amplify an audio signal received from input connector 102, and provide an amplifier audio output signal to output connector 104. Connectors 102 and 104 may be standard 2.5 mm, 3.5 mm, or 6.4 mm stereo jacks. Input connector 102 may be used to connect an audio source, e.g. a portable MP3 player, a cellular telephone, a radio or the like. Output connector 104 may be used to connect a headphone, a speaker or the like.

The amplitude of the audio output signal at output connector 104 and thereby the volume of an attached speaker or headphone can be adjusted through potentiometer 106. Potentiometer 106 acts as a voltage divider for the audio input signal provided to input connector 102. The potentiometer output voltage is provided to the operational amplifier 100 through a decoupling capacitor 108, which eliminates any DC bias of the audio input signal. A voltage divider formed by resistors 120 and 122 is used to bias operational amplifier 100. The tap point on the voltage divider is bypassed for AC signals by capacitor 118, restoring some AC power supply rejection. Resistor 116 provides a DC return path for the VCC/2 reference voltage and also sets the circuit's (AC) input impedance. Resistors 110 and 112 and capacitor 114 determine the circuit's gain and bandwidth as described in AN-581 Application Note by Analog Devices, available online at http://www.analog.com, which is hereby incorporated by reference.

Operational amplifier 100 may e.g. be a Rail-to-Rail, High Output Current Amplifier AD8397 manufactured by Analog Devices. Output 101 of operational amplifier 100 is at a potential of half of its supply voltage Vcc. Theoretically, the maximum amplitude of output 101 could hence be Vcc. In practice, however, the maximum amplitude of an AD8397 operational amplifier has to stay within 0.5V of supply rails. The maximum amplitude is hence Vcc-1V. If the operational amplifier AD8397 were powered directly by a battery having a battery voltage Vbat of 4.2V, the maximum amplitude of the output would hence be only 3.2V.

To achieve higher output voltages operational amplifier 100 is powered by a variable supply voltage Vcc, which is generated in step-up converter 134. Vcc may be higher than the battery voltage Vbatt powering audio amplifier circuit 1. Step-up converter 134 is configured to raise battery voltage Vbat to operational amplifier variable supply voltage Vcc at its output 158. Vcc is selected to be sufficiently high in order to avoid clipping of the audio output signal at output 101 of operational amplifier 100. Variable supply voltage Vcc is selected from a set of predetermined voltages Vcc1 .... Vccx.

Audio output voltage 101 of operational amplifier 100 is compared with a first reference voltage Vref1 in a first comparator 130. The comparison, which is reflected in the output 131 of first comparator 130, is used to determine the level of operational amplifier supply voltage Vcc that is required to avoid clipping. The audio output signal at output 101 swings around Vcc/2. Vref1 is selected to be below Vcc/2, but above a minimum voltage at which clipping would occur. The minimum voltage at which clipping may occur in an AD8397 operational amplifier is 0.5V. Vref1 may therefore be selected as 0.53V. If the voltage at output 101 falls below Vref1 operational amplifier 100 is close to its limits, and its output is at risk of getting distorted. To avoid such distortion Vcc is increased, if the voltage at operational amplifier output 101 falls below Vref1. Vcc may be raised in several discrete voltage steps Vstep as long as first comparator 130 through its output 131 indicates a voltage at output 101 below Vref1, or until a maximum voltage Vccmax is reached. Output 131 of first comparator 130 provides a step-up signal to a microcontroller 166 input IN1. The microcontroller 166 controls step-up converter 134, which may for example be a 1.2 MHz DC-to-DC Step-Up Switching Converter ADP1610 manufactured by Analog Devices. Step-up converter 134 is powered by a battery through battery input 136. Inductor 142 stores energy during the on-time of step-up converter 134, and transfers that energy to the output 158 through the output rectifier 144 during the off-time. Resistor 145 and capacitor 147 smoothen the output of step-up converter 134.

While a high supply voltage Vcc of operational amplifier 100 is beneficial to eliminate clipping and distortion of the audio signal at operational amplifier output 101, it comes at a cost of increased losses in step-up converter 134 and correspondingly reduced battery life. Beneficially, Vcc is hence only raised as much as necessary to avoid distortion of the output 101 of operational amplifier 100. If the signal at output 101 of operational amplifier 100 is small, Vcc may be lowered. A second comparator 132 compares the voltage of output 101 with a second reference voltage Vref2. Vref2 is selected to indicate, if the voltage of output 101 would be clipped, if Vcc were to be lowered by Vstep. Vref2 is hence selected as Vref2=Vstep/2+Vref1. In one exemplary embodiment Vstep may be 2.3V and Vref1 may be 0.53V. Hence, Vref2 in this example will be 2.3V/2+0.53V=1.68V.

Output 133 of second comparator 132 may be used to assess, if Vcc can be lowered by one step Vstep without risking distortion of the audio signal at operation amplifier output 101. Vcc may be lowered by one step Vstep, if the voltage at output 101 of operational amplifier 100 has not fallen below Vref2 for a predetermined amount of time, e.g. for 20 sec. Output 133 of comparator 132 may be operatively connected to an input IN2 of the microcontroller 166. The microcontroller is also operatively connected to step-up converter 134, and more particularly controls switches 138, 152, 154 and 156 of step-up converter 134. Operational amplifier 100, step-up converter 134, first comparator 131 and second comparator 132 are operatively connected to a common ground.

Figure 2:
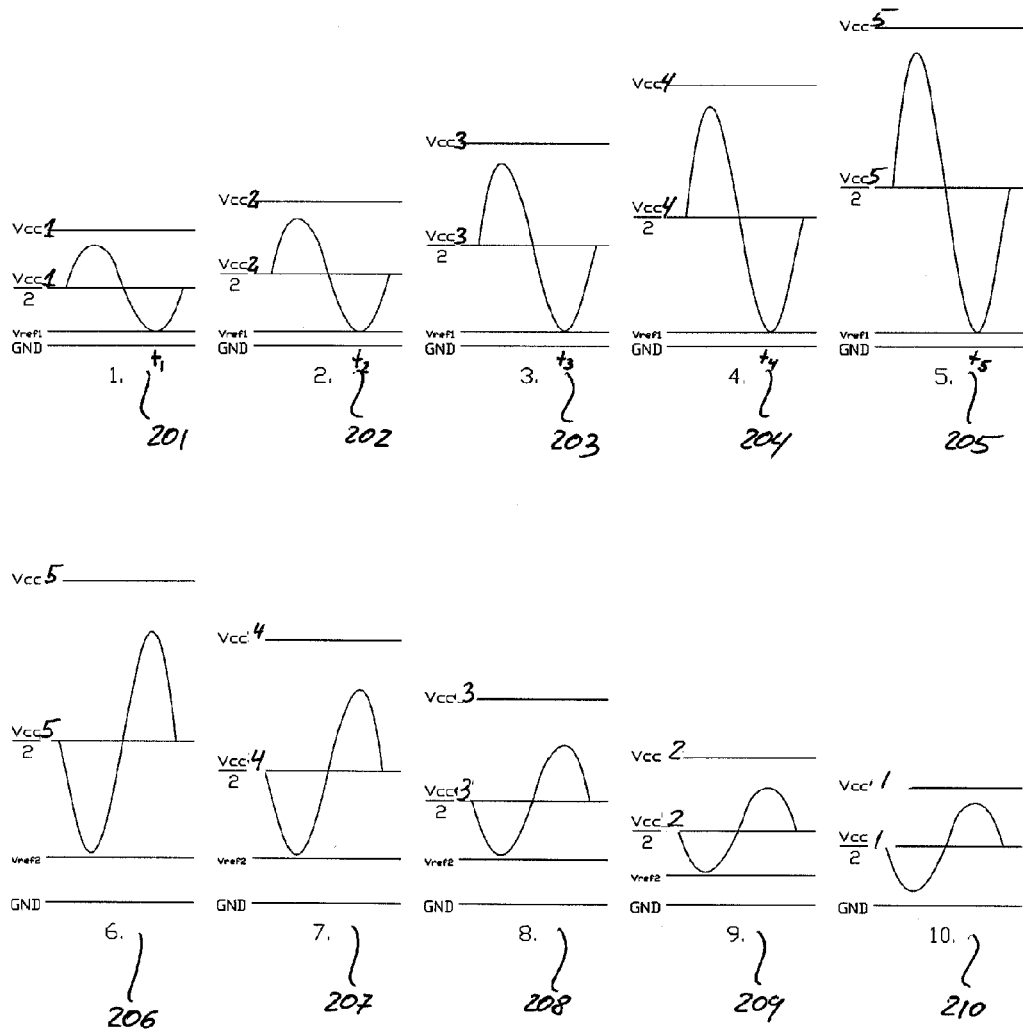
FIG. 2 is an illustration of various output signals of a class G audio amplifier circuit.

An exemplary use of amplifier circuit 1 is further explained with respect to operating modes as illustrated in FIG. 2. In a first operating mode as illustrated in graph 201 Vcc1 is equal to Vbat, which is e.g. 4.2V. In this operating mode step-up converter 134 is disabled. Disabling of step-up converter 134 is achieved by opening switch 138, so that the SD input of step-up converter 134 is low. Switch 138 is controlled by the microcontroller 166. In this first operating mode bypass diode 140 is conductive, so that Vcc is approximately Vbat. More precisely, Vcc equals Vbat minus the voltage drop across diode 140. As indicated in graph 201 at a time t1 the output signal falls below Vref1 (0.53V), causing the output 131 of first comparator 130 to turn low. The low-signal of output 131 is read by the microcontroller 166, which responsive to the low-signal of output 131 closes switch 138. As shown in graph 202 this activates step-up converter 134, which now produces a constant voltage Vcc2 of 5V.

In the second operating mode as illustrated in graph 202 step-up converter 134 is active, producing a voltage Vcc2 at its output 158 of 5V. At time t2 the voltage at output 101 of operational amplifier 100 falls once again below Vref1, i.e. below 0.53V, which indicates the operational amplifier is close to its limits, and the output may get distorted when the signal is further increased. Output 131 of first comparator 130 turns low again at time t2, which is detected by the microcontroller. The microcontroller now closes switch 152, which is operatively connected to the feedback pin FB of step-up converter 134. The feedback pin FB of step-up converter 134 is configured such, that its voltage has to be constant at 1.23V. The voltage at feedback pin FB of step-up converter 134 is a function of the output voltage Vcc at output 158, which is divided by a voltage divider formed by resistors 146, 148, 160, 162, and 164. By closing switch 152 resistor 160 is now in parallel to resistor 148, thus lowering the total resistance below that of resistor 148 alone. Consequently, to reach the same voltage of 1.23 V at feedback pin FB, Vcc has to go up by Vstep. The values of resistors 146, 148, 160, 162, and 164 are selected such, that Vstep is 2.3V. By closing switch 152 the amplifier enters a third operating mode illustrated in graph 203.

In the third operating mode as illustrated in graph 203 step-up converter 134 produces a constant output voltage Vcc3 of 7.3V. At time t3 the voltage at output 101 of operational amplifier 100 once again falls below Vref1. This causes the microcontroller 166 to further raise Vcc by closing switch 154. The resulting fourth operating mode is illustrated in graph 204.

In the fourth operating mode as illustrated in graph 204 step-up converter 134 produces a constant output voltage Vcc4 of 9.6V. At time t4 the voltage at output 101 of operational amplifier 100 once again falls below Vref1. This causes the microcontroller 166 to further raise Vcc by closing the last remaining switch 156. The resulting fifth operating mode is illustrated in graph 205.

In the fifth operating mode as illustrated in graph 205 the operational amplifier 100 is powered by the maximum supply voltage Vcc5 of 11.9V. Vcc cannot be raised any further. Vcc5 equals Vccmax of 11.9V and has been selected to not exceed the operating limits of the step-up converter 134, the operational amplifier 100, the comparators 130/132, the capacitors and the resistors in the circuit and the maximal acceptable battery uptake current.

As illustrated in graph 206 the voltage at output 101 of operational amplifier 100 is above Vref2, which in this fifth operating mode is 1.68V. Output 133 of second comparator 132 is high. This indicates that Vcc5 could be lowered by Vstep (2.3V) without causing the output signal to be clipped. The microcontroller 166 is operatively connected to output 133 and configured to read output 133. If output 133 has been high for a predetermined amount of time, e.g. 20 seconds, the microcontroller 166 opens switch 156, thus lowering Vcc from its level Vcc5 of 11.9V to Vcc4 of 9.6V. Comparator 132 indicates, if sufficient headroom is available to lower Vcc by one step Vstep, and still keep the signal above Vref1=0.53V. Hence Vref2=Vstep/2+Vref1=1.68V.

Graph 207 illustrates the amplifier circuit 1 in the fourth operating mode with Vcc4=9.6V. The output signal is shown not to fall below Vref2 of 1.68V for a predetermined amount of time. Consequently, microcontroller 166 opens switch 154 to lower the supply voltage of operational amplifier 100 to Vcc3 of 7.3V as shown in graph 208.

Graph 208 illustrates the amplifier in the third operating mode with Vcc3=7.3V. The output signal is shown not to fall below Vref2 of 1.68V for a predetermined amount of time. Consequently, microcontroller 166 opens switch 152 to lower the supply voltage of operational amplifier 100 to Vcc2 of 5V as shown in graph 209.

Graph 209 illustrates the amplifier in the second operating mode with step-up converter 134 producing supply voltage for operational amplifier 100 of Vcc2=5V. In this second operating mode Vref2 is 0.93V and not 1.68V as in the previous steps. This is, because Vcc2 (5V) is only 0.8V above Vcc1 (4.2V). Again, the microcontroller 166 determines if the voltage of output signal 101 stays above Vref2 for a predetermined amount of time. If it does, the microcontroller 166 opens switch 138 to disable step-up converter 134. This causes the supply voltage of operational amplifier 100 to drop to Vcc1=4.2V, as illustrated in graph 210.

While the present invention has been described with reference to exemplary embodiments, it will be readily apparent to those skilled in the art that the invention is not limited to the disclosed or illustrated embodiments but, on the contrary, is intended to cover numerous other modifications, substitutions, variations and broad equivalent arrangements that are included within the spirit and scope of the following claims.

What is claimed is:

1. An audio amplifier circuit, comprising:
   an operational amplifier, the operational amplifier operatively connected to an audio input and an audio output;
   a step-up converter, the step-up converter having an output that is operatively connected to the operational amplifier and provides a variable supply voltage Vcc to the operational amplifier, the variable supply voltage Vcc being selected from a set of predetermined voltages;
   a first comparator configured to compare the voltage at the output of the operational amplifier with a first reference voltage Vref1, wherein the first reference voltage Vref1 is selected such, that the output of the first comparator creates a first signal which indicates a need to raise the supply voltage Vcc to the operational amplifier to avoid clipping of the output of the operational amplifier;
   a second comparator configured to compare the voltage at the output of the operational amplifier with a second reference voltage Vref2, wherein the second reference voltage Vref2 is selected such, that the output of the second comparator creates a second signal which indicates a possibility to lower the voltage of the step-up converter output without causing clipping of the output of the operational amplifier;
   a microcontroller, operatively connected to the step-up converter, the first comparator, and the second comparator,
   wherein the microcontroller is configured to raise the variable supply voltage Vcc to the operational amplifier in response to the first signal from the first comparator by Vstep, and to lower the variable supply voltage Vcc to the operational amplifier in response to the second signal from the second comparator by Vstep.

2. The audio amplifier circuit as in claim 1, the step-up converter comprising a step-up converter input which is operatively connected to a battery having a battery voltage Vbat,
   further comprising a bypass diode between the step-up converter input and the step-up converter output, wherein the bypass diode is conductive and provides the supply voltage Vcc to the operational amplifier when the step-up converter is disabled.

3. The audio amplifier circuit as in claim 1 wherein Vstep is between 1V and 3V.

4. The audio amplifier circuit as in claim 2 being operated in a mode with disabled step-up converter.

5. The audio amplifier circuit as in claim 1, wherein the microcontroller is configured to lower the variable supply voltage Vcc to the operational amplifier when the second signal from the second comparator has been present for a predetermined amount of time.

6. The audio amplifier circuit as in claim 1, wherein the microcontroller is configured to lower the variable supply voltage Vcc to the operational amplifier when the second signal from the second comparator has been present for more than 5 seconds.

7. The audio amplifier circuit as in claim 1, wherein Vref2=Vstep/2+Vref1.

8. The audio amplifier circuit as in claim 1, wherein Vref1 is between 0.1V and 1V.

9. The audio amplifier circuit as in claim 1, wherein Vref2 is between 1V and 3V.

* * * * *